United States Patent
Ryu

(10) Patent No.: US 8,901,639 B2
(45) Date of Patent: Dec. 2, 2014

(54) MONOLITHIC BIDIRECTIONAL SILICON CARBIDE SWITCHING DEVICES

(75) Inventor: Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 132 days.

(21) Appl. No.: 13/559,246

(22) Filed: Jul. 26, 2012

(65) Prior Publication Data

US 2014/0027781 A1   Jan. 30, 2014

(51) Int. Cl.
*H01L 27/088* (2006.01)
*H01L 29/78* (2006.01)

(52) U.S. Cl.
USPC .......................................... 257/328; 257/409

(58) Field of Classification Search
CPC .................................................. H01L 27/0727
See application file for complete search history.

(56) References Cited

U.S. PATENT DOCUMENTS

| | | | |
|---|---|---|---|
| 5,506,421 A | | 4/1996 | Palmour |
| 7,414,268 B2 * | | 8/2008 | Ryu et al. .................... 257/77 |
| 7,842,549 B2 | | 11/2010 | Ryu et al. |
| 2004/0248330 A1 * | | 12/2004 | Kitabatake et al. ............ 438/17 |
| 2008/0029838 A1 | | 2/2008 | Zhang et al. |
| 2009/0212301 A1 | | 8/2009 | Zhang et al. |
| 2009/0289262 A1 | | 11/2009 | Zhang et al. |

OTHER PUBLICATIONS

Bhatnagar et al., "Comparison of 6H--SiC, 3C--SiC and Si for Power Devices", IEEE Transactions on Electron Devices, vol. 40, 1993, pp. 645-655.
Morita et al., "650V 3.1 m□-cm² GaN-based Monolithic Bidirectional Switch Using Normally-off Gate Injection Transistor," IEDM 2007.

* cited by examiner

*Primary Examiner* — Stephen W Smoot
(74) *Attorney, Agent, or Firm* — Myers Bigel Sibley & Sajovec, P.A.

(57) ABSTRACT

A monolithic bidirectional switching device includes a drift layer having a first conductivity type and having an upper surface, and first and second vertical metal-oxide semiconductor (MOS) structures at the upper surface of the drift layer. The drift layer provides a common drain for the first and second vertical MOS structures. The first and second vertical MOS structures are protected by respective first and second edge termination structures at the upper surface of the drift layer. A monolithic bidirectional switching device according to further embodiments includes a vertical MOS structure at the upper surface of the drift layer, and a diode at the upper surface of the drift layer. The drift layer provides a drain for the vertical MOS structure and a cathode for the diode, and the vertical MOS structure and the diode are protected by respective first and second edge termination structures.

18 Claims, 5 Drawing Sheets

MONOLITHIC BIDIRECTIONAL SILICON CARBIDE SWITCHING DEVICES

FIELD OF THE INVENTION

The present invention relates to silicon carbide electronic devices. More particularly, the present invention relates to silicon carbide electronic devices including metal-oxide-semiconductor structures.

BACKGROUND

Power semiconductor devices are widely used to carry large currents and support high voltages. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region.

Recent development efforts in power devices have also included investigation of the use of silicon carbide (SiC) devices for power devices. Silicon carbide (SiC) has a combination of electrical and physical properties that make it attractive for a semiconductor material for high temperature, high voltage, high frequency and high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

SUMMARY

A monolithic bidirectional switching device according to some embodiments includes a drift layer having a first conductivity type and having an upper surface, and first and second vertical metal-oxide semiconductor (MOS) structures at the upper surface of the drift layer. The drift layer provides a common drain for the first and second vertical MOS structures. The first and second vertical MOS structures are protected by respective first and second edge termination structures at the upper surface of the drift layer. The drift layer may include silicon carbide.

The first edge termination structure includes a first plurality of guard rings having a second conductivity type opposite the first conductivity type in the upper surface of the drift layer. The second edge termination structure includes a second plurality of second conductivity type guard rings in the upper surface of the drift layer.

The monolithic bidirectional switching device may further include a substrate having the first conductivity type with the drift layer provided on a first surface of the substrate and a metal layer on a second surface of the substrate opposite the first surface.

The first MOS structure may include a first well region having the second conductivity type at the upper surface of the drift layer, a first source region in the first well region, the first source region having the first conductivity type, a first gate insulator on the upper surface of the drift layer and defining a channel region in the first well region adjacent the first source region, a first gate contact on the first gate insulator, and a first source contact on the first source region and on the first well region.

The first source contact may form an ohmic contact with the first source region and the first well region, and the second source contact may form an ohmic contact with the second source region and the second well region.

The second MOS structure may include a second well region at the upper surface of the drift layer, a second source region in the second well region, a second gate insulator on the upper surface of the drift layer and defining a channel region in the second well region adjacent the second source region, a second gate contact on the second gate insulator, and a second source contact on the second source region and on the second well region.

The monolithic bidirectional switching device may further include a third well region at the surface of the drift layer, the third well region spaced apart from the first well region and defining a first vertical current flow region in the drift layer between the first well region and the third well region, a third source region in the third well region, a third source contact on the third source region and the third well region.

The monolithic bidirectional switching device may further include a fourth well region at the surface of the drift layer, the fourth well region spaced apart from the second well region and defining a second vertical current flow region in the drift layer between the second well region and the fourth well region, a fourth source region in the fourth well region, and a fourth source contact on the fourth source region and the fourth well region.

A packaged electronic device according to some embodiments includes a package housing, a monolithic bidirectional switching device within the package housing, and a plurality of electrical leads coupled to the monolithic bidirectional switching device and extending from the housing. The monolithic bidirectional switching device includes a drift layer having a first conductivity type and having an upper surface and first and second vertical metal-oxide semiconductor (MOS) structures at the upper surface of the drift layer, wherein the drift layer provides a common drain for the first and second vertical MOS structures, and wherein the first and second vertical MOS structures are protected by respective first and second edge termination structures at the upper surface of the drift layer.

A monolithic bidirectional switching device according to further embodiments includes a drift layer having a first conductivity type and having an upper surface, a vertical metal-oxide semiconductor (MOS) structure at the upper surface of the drift layer, and a diode at the upper surface of the drift layer. The drift layer provides a drain for the vertical MOS structure and a cathode for the diode, and the vertical MOS structure and the diode are protected by respective first and second edge termination structures at the upper surface of the drift layer.

The first edge termination structure may include a first plurality of guard rings in the upper surface of the drift layer, and the second edge termination structure may include a second plurality of guard rings in the upper surface of the drift layer.

The monolithic bidirectional switching device may further include a substrate having the first conductivity type. The drift layer is provided on a first surface of the substrate, and a metal layer is on a second surface of the substrate opposite the first surface.

The MOS structure may include a well region at the upper surface of the drift layer, a source region in the well region, a gate insulator on the upper surface of the drift layer and defining a channel region in the well region adjacent the source region, a gate contact on the gate insulator, and a source contact on the source region and on the well region. The source contact may form an ohmic contact with the source region and the well region.

The monolithic bidirectional switching device may further include a second well region at the surface of the drift layer and spaced apart from the well region. The second well region defines a vertical current flow region in the drift layer between the well region and the second well region. A second source region is in the second well region, and a second source contact is on the second source region and the second well region.

The diode may include a Schottky contact that forms a Schottky junction with the drift layer. The diode may further includes a plurality of junction barrier regions in the drift layer.

A packaged electronic device according to further embodiments includes a package housing and a monolithic bidirectional switching device within the package housing. The monolithic bidirectional switching device includes a drift layer having a first conductivity type and having an upper surface, a vertical metal-oxide semiconductor (MOS) structure at the upper surface of the drift layer, and a diode at the upper surface of the drift layer. The drift layer provides a drain for the vertical MOS structures and a cathode for the diode, and the vertical MOS structure and the diode are protected by respective first and second edge termination structures at the upper surface of the drift layer. The package further includes a plurality of electrical leads coupled to the monolithic bidirectional switching device and extending from the housing.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
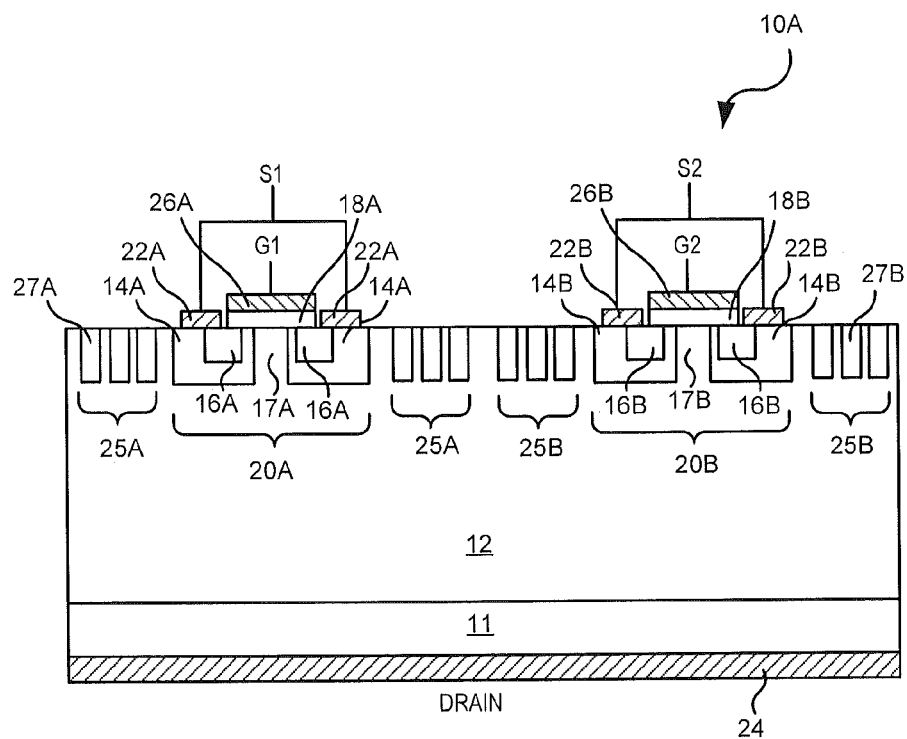
FIG. 1A is a cross-section of a monolithic switching device according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Some embodiments provide a monolithic electronic device including two back-to-back connected high voltage MOSFET devices. By providing two blocking junctions, bidirectional blocking capability is provided. That is, high voltages can be blocked in both the forward and reverse directions. A conventional MOSFET device can provide single sided blocking capability. Thus, conventional devices may be limited in DC applications. To provide bidirectional blocking capability with conventional devices requires the fabrication and interconnection of two discrete devices, which increases the expense and complexity of the circuit. By providing a monolithic device with bidirectional blocking capability, the device can be used directly in AC applications, such as matrix converters.

Figure 1B:
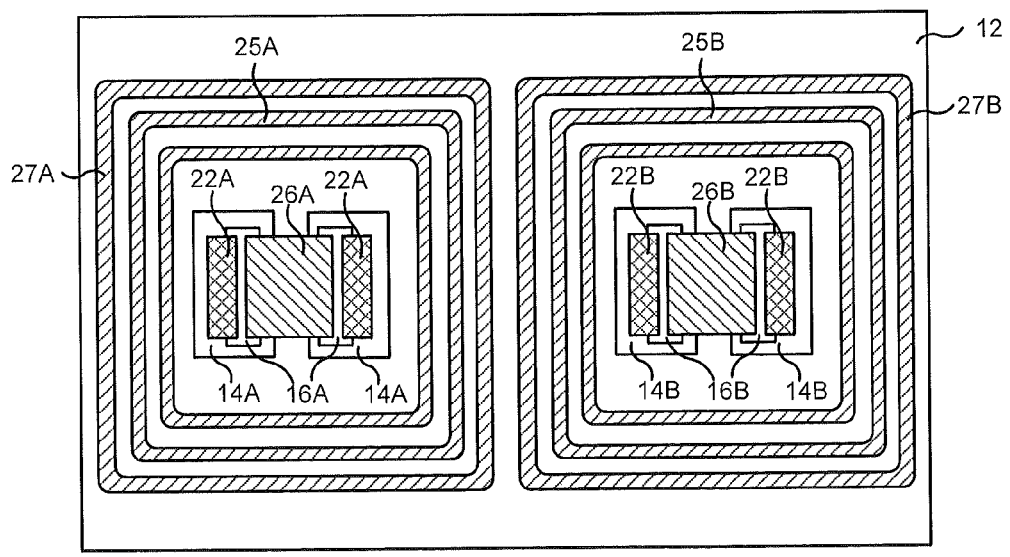
FIG. 1B is a plan view of the monolithic switching device of FIG. 1A.
Figure 2:
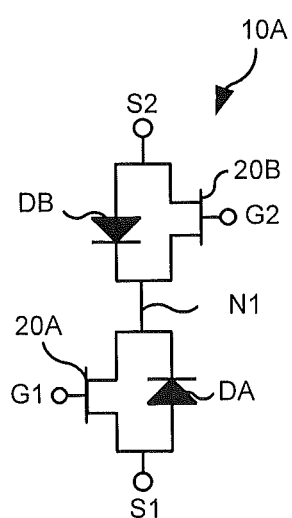
FIG. 2 is a schematic diagram showing an equivalent circuit of the structure shown in FIG. 1.

FIG. 1A is a cross sectional view of an example of a monolithic bidirectional switching device implemented using silicon carbide vertical power MOSFETs. The use of silicon carbide may provide certain advantages due to the electrical and physical properties of silicon carbide. It will be appreciated, however, that other types of materials besides silicon carbide can be used for the switching devices. FIG. 1B is a plan view of the monolithic bidirectional switching device of FIG. 1A. FIG. 2 is an equivalent circuit of the device shown in FIGS. 1A and 1B. It will be appreciated that the structures shown in FIGS. 1A and 1B are simplified for ease of understanding, and that particular implementations may include multiple cells, gate fingers, etc.

Referring to FIGS. 1A and 1B, a monolithic bidirectional switching device 10A includes an optional substrate 11 on which a drift layer 12 having a first conductivity type is provided. The substrate 11 may be an n-type 4H—SiC substrate, and the drift layer 12 may be a silicon carbide epitaxial layer provided on the substrate 11. The drift layer 12 may be doped with n-type dopants at a doping concentration of about $5 \times 10^{14}$ cm$^{-3}$ to about $2 \times 10^{17}$ cm$^{-3}$ and may have a thickness of about 5 µm to about 50 µm. In particular embodiments, the drift layer 12 may be doped with n-type dopants at a doping concentration of $5 \times 10^{15}$ cm$^{-3}$ and may have a thickness of about 5 µm.

Two metal-oxide semiconductor (MOS) transistor devices having vertical device structures are formed in/on the drift layer 12. In particular, a first MOS device structure 20A includes a pair of spaced apart well regions 14A at an upper surface of the drift layer 12 opposite the substrate 11. The well regions 14A have a second conductivity type that is opposite the first conductivity type. For example, when the drift layer 12 is n-type, the well regions 14A may be p-type. The well regions 14A may be doped with p-type dopants at a doping concentration of $1 \times 10^{16}$ cm$^{-3}$ to $5 \times 10^{19}$ cm$^{-3}$ and may extend to a depth of about 0.2 µm to about 2 µM into the drift layer 12. In particular embodiments, the well regions 14A may be doped with aluminum and/or boron at a concentration of about $5 \times 10^{17}$ cm$^{-3}$ and may extend to a depth of about 1 µm into the drift layer 12.

In particular embodiments, the well regions 14A maybe formed, for example via ion implantation, in the epitaxial layer 12. The well regions 14A may be formed, for example, via implantation of ions having a total dose of $2.76 \times 10^{14}$ cm$^{-2}$ and an implant energy of 360 keV at a temperature of 650° C.

Source regions 16A having the first conductivity type are formed in the well regions 14A. In particular embodiments, the source regions 16A may be doped with n-type dopants at a doping concentration of about $1 \times 10^{18}$ cm$^{-3}$ to about $5 \times 10^{21}$ cm$^{-3}$ and may extend to a depth of about 0.1 µm to about 1 µm into the well regions 14A. In particular embodiments, the source regions 16A may be doped with n-type dopants at a concentration of about $5 \times 10^{20}$ cm$^{-3}$ and may extend to a depth of about 0.3 µm into the well regions 14A.

The source regions 16A may be formed in the well regions 14A, for example, by selective implantation of n-type dopants, such as nitrogen and/or phosphorus ions. The source regions 16A may be formed, for example, via implantation of n-type dopants having a total dose of $8.1 \times 10^{14}$ cm$^{-2}$ and an implant energy of 140 keV at a temperature of 650° C.

A vertical current flow region 17A (sometimes referred to as a junction field effect transistor, or JFET, region) is defined in the drift layer 12 between the spaced apart well regions 14A. A channel region is defined in the well regions 14A between the source regions 16A and the vertical current flow region 17A. In reverse bias conditions, a depletion region between the well region 14A and the drift layer 12 expands to fill the vertical current flow region, which protects the channel region and the gate insulator from high reverse voltages.

A gate insulator 18A is provided on the upper surface of the drift layer 12 and extends across the channel regions and onto the source regions 16A. In particular, an oxide layer may be grown on the exposed surface of the epitaxial layer 12 and patterned to form the gate insulator 18A. The gate insulator 18A may be grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety.

As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz furnace tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used. Higher temperatures may be achieved for the dry $O_2$ growth by using, for example, a silicon carbide furnace instead of a quartz tube. However, higher temperatures may not improve the quality of the oxide.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour.

The wet $O_2$ oxide anneal may be performed at a temperature of about 950° C. or less for a time of at least about 1 hour. The temperature of the wet $O_2$ anneal may be limited to discourage further thermal oxide growth at the $SiC/SiO_2$ interface, which may introduce additional interface states. In particular, the wet $O_2$ anneal may be performed in wet $O_2$ at a temperature of about 950° C. for about 3 hours. The resulting gate oxide layer 22 may have a thickness of about 400 Å to 600 Å, and in particular may have a thickness of about 500 Å.

In some embodiments, the steam used in the wet $O_2$ anneal process may be generated using a pyrogenic process, and the resulting wet $O_2$ anneal may be referred to as a "pyrogenic oxidation." In a pyrogenic oxidation, oxygen ($O_2$) gas and hydrogen ($H_2$) gas are flowed into a pyrogenic chamber, which is separate from the anneal chamber, and which is heated to a high temperature, such as about 800° C. The hydrogen and oxygen gas combust in the pyrogenic chamber and form a mixture of steam ($H_2O$) and oxygen ($O_2$), which is supplied to the anneal chamber.

In some cases, it may be desirable to adjust the flow rates of hydrogen and oxygen into the pyrogenic chamber so that a molecular ratio of hydrogen to oxygen approaches, but does not exceed, a 2:1 ratio. That is, it may be desirable for the mixture supplied to the anneal chamber to be as wet as possible, within reasonable safety limits. In some cases, a hydrogen/oxygen ratio of 1.8:1 or 1.9:1 may be used.

A gate contact 26A is provided on the gate insulator 18A. The gate contact 26A may include, for example, polysilicon doped with boron and may have a thickness of about 450 nm. In some embodiments, a polysilicon gate contact 26A may be deposited and doped, for example, with boron followed by a metallization process to reduce the gate resistance.

Source contacts 22A are formed on the source regions 16A and the well regions 14A and form ohmic contacts thereto. The source ohmic contacts 22A may include about 50-80 nm of nickel, and may be rapid thermal annealed at about 825° C. for about 2 minutes in an atmosphere of argon. Thick Ti/Au of Al layers (not shown) may be used for pad metals. The source ohmic contacts 22A may extend onto the well regions 14A and may form ohmic contacts with both the well regions 14A and the source regions 16A.

A source terminal S1 is coupled to the source contacts 22A, while a gate terminal G1 is coupled to the gate contact 26A.

A junction termination 25A is provided around the periphery of the first MOSFET device structure 20A. In the embodiments illustrated in FIGS. 1A and 1B, the junction termination 25A includes a plurality of floating field rings 27A formed as doped regions in the drift layer 12 having the second conductivity type. The formation of floating field rings in silicon carbide devices is well known. The junction termination may be implemented using other types of structures, including for example field plates, junction termination extension (JTE) regions, etc. In particular embodiments, the floating field rings 27A may be doped with p-type dopants at a doping concentration of $5 \times 10^{16}$ cm$^{-3}$ to $1 \times 10^{18}$ cm$^{-3}$ and may extend to a depth of 0.1 µm to 2 µm into the drift layer 12. The floating field rings 27A may have a width of about 1 µm and a pitch (i.e., center-to-center spacing of adjacent rings) of about 2.5 µm. Edge terminations are described, for example, in U.S. Publication No. 2009/0212301, entitled "Double Guard Ring Edge Termination for Silicon Carbide Devices and Methods of Fabricating Silicon Carbide Devices Incorporating Same" and U.S. Pat. No. 7,842,549, entitled "Methods Of Fabricating Silicon Carbide Devices Incorporating Multiple Floating Guard Ring Edge Terminations," the disclosures of which are incorporated herein by reference in its entirety.

Likewise, a second MOSFET device 20B is provided in the drift layer 12. The second MOSFET device 20B is spaced apart laterally from the first MOSFET device 20B on the upper surface of the drift layer 12. The second MOSFET device 20B may be formed at the same time and using the same process steps as described above with respect to the first MOSFET device 20A. In some embodiments, the second MOSFET device 20B may be formed separately from the first MOSFET device 20A and may be formed using different processing steps.

In particular, the second MOSFET device structure 20B includes a pair of spaced apart well regions 14B at an upper surface of the drift layer 12 opposite the substrate 11. The well regions 14B have a second conductivity type that is opposite the first conductivity type. For example, when the drift layer 12 is n-type, the well regions 14B may be p-type. The well regions 14B may be doped with p-type dopants at a doping concentration of about $1 \times 10^{16}$ cm$^{-3}$ to about $5 \times 10^{19}$ cm$^{-3}$ and may extend to a depth of about 0.2 µm to about 2 µm into the drift layer 12. In particular embodiments, the well regions 14B may be doped with p-type dopants at a doping concentration of about $5 \times 10^{17}$ cm$^{-3}$ and may extend to a depth of about 1 µm into the drift layer 12.

Source regions 16B having the first conductivity type are formed in the well regions 14B. The source regions 16B may be doped with n-type dopants at a doping concentration of about $1 \times 10^{18}$ cm$^{-3}$ to about $5 \times 10^{21}$ cm$^{-3}$ and may extend to a depth of about 0.1 µm to about 1 µm into the well regions 14B. In particular embodiments, the source regions 16B may be doped with n-type dopants at a doping concentration of about $5 \times 10^{20}$ cm$^{-3}$ and may extend to a depth of about 0.3 µm into the well regions 14B.

A vertical current flow or JFET region 17B is defined in the drift layer 12 between the spaced apart well regions 14B. A channel region is defined in the well regions 14B between the source regions 16B and the vertical current flow region 17B.

A gate insulator 18B is provided on the upper surface of the drift layer 12 and extends across the channel regions and onto the source regions 16B, and a gate contact 26B is provided on the gate insulator 18B. Source contacts 22B are formed on the source regions 16B and the well regions 14B and form ohmic contacts thereto. The source ohmic contacts 22B may extend onto the well regions 14B and may form ohmic contacts with both the well regions 14B and the source regions 16B.

A source terminal S2 is coupled to the source contacts 22B, while a gate terminal G2 is coupled to the gate contact 26B. A drain contact 24 is provided on the substrate 11 opposite the drift layer 12 and forms an ohmic contact thereto. The drain contact may be any suitable metal, such as nickel, for example.

A junction termination 25B is provided around the periphery of the second MOSFET device structure 20B. In the embodiments illustrated in FIGS. 1A and 1B, the junction termination 25B includes a plurality of floating field rings 27B formed as doped regions in the drift layer 12 having the second conductivity type. In particular embodiments, the floating field rings 27B may be doped with p-type dopants at a doping concentration of $5 \times 10^{16}$ cm$^{-3}$ to $1 \times 10^{18}$ cm$^{-3}$ and may extend to a depth of 0.1 µm to 2 µm into the drift layer 12. The floating field rings 27B may have a width of about 1 µm and a pitch (i.e., center-to-center spacing of adjacent rings) of about 2.5 µm. It will be appreciated that the first and second MOSFET structures 20A, 20B may have similar or different junction termination structures.

Optionally, the backside of the substrate 11 (opposite the drift layer 12) can be coated with a metal 24 to reduce the resistance between the first and second MOSFET devices 20B.

A field oxide (not shown) including, for example, 5000 Å of high temperature oxide may be deposited, for example by high temperature chemical vapor deposition, to isolate the device 10A. The field oxide may be blanket deposited and subsequently patterned to expose the active regions of the device 10A including the source regions 16A, 16B and the channel regions. The field oxide may be formed prior to forming the gate insulators 18A, 18B, the source contacts 22A, 22B and the gate contacts 26A, 26B.

FIG. 2 is a schematic circuit diagram of the device structure 10A shown in FIGS. 1A and 1B. As shown therein, the device includes a pair of MOSFET devices 20A and 20B with their drain terminals connected together at a common node Ni. Each of the MOSFET devices 20A and 20B has a respective body diode DA, DB coupled in parallel with the device. Referring to FIG. 1A, the body diode DA is formed by the p-n junction between the well regions 14A and the drift layer 12, while the body diode DB is formed by the p-n junction between the well regions 14B and the drift layer 12.

Operation of the bidirectional switch 10A will now be described with reference to FIGS. 1 and 2. When the source S2 of the second MOSFET structure 20B is held at a sufficiently high positive potential, the body diode DB of the second MOSFET 20B is forward biased and turns on. The on-off status of the switch 10A can then be controlled by the gate G1 of the first MOSFET device 20A, which can turn on/off the first MOSFET device 20A. For example, if the gate G1 of the first MOSFET device 20A is on, the switch 10A is on (i.e., the device 10A will conduct current between the source terminal S1 of the first MOSFET device 20A and the source terminal S2 of the second MOSFET device 20B). If the gate G1 is off, the switch 10A is off, and the device 10A blocks current from flowing between the source terminal S1 of the first MOSFET device 20A and the source terminal S2 of the second MOSFET device 20B.

The forward voltage drop of the switch 10A is then determined by the on-resistance of first MOSFET device 20A, the drift resistance of the second MOSFET device 20B, and the junction drop of the body diode DB of the second MOSFET device 20B. The forward voltage drop of the second MOSFET device 20B can be reduced by applying a sufficient voltage to the gate G2 of the second MOSFET device 20B, which turns the device on and bypasses the junction drop of the body diode DB of the second MOSFET device 20B.

When the source terminal S2 of the second MOSFET device 20B is at a negative potential, the body diode DA of the first MOSFET device 20A is forward biased and turns on. The on-off status of the switch can then be controlled by the gate terminal G2 of the second MOSFET device 20B, which can turn on/off the second MOSFET device 20B. For example, if the gate terminal G2 is on, the second MOSFET device 20A becomes conductive and the switch 10A is on. If the gate terminal G2 is off, the switch 10A is off. The forward voltage drop of the switch 10A is determined by the on-resistance of second MOSFET device 20B, the drift resistance of first MOSFET device 20A, and the junction drop of the body diode DA of the first MOSFET device 20A. The forward voltage drop of the first MOSFET device 20A can be reduced by turning on G1, which bypasses the junction drop of the body diode DA of the first MOSFET device 20A.

A bidirectional switch structure using lateral GaN devices is described in Morita et al., "650V 3.1 mΩ-cm$^2$ GaN-based Monolithic Bidirectional Switch Using Normally-off Gate Injection Transistor," IEDM 2007. However, lateral devices rely on the lateral distance between the first and second sources S1 and S2 of the devices for the support of high voltage, which is limited by the ruggedness of the passivation material. In addition, a high density design may not be possible because of the wide voltage supporting regions. To make the devices and cell pitches reasonable, there is a limitation in blocking voltages and current ratings for implementations using lateral devices.

In contrast, a device according to some embodiments has a vertical device structure. A much tighter cell pitch design can be used to increase the current rating of the device. The distance between the source regions 16A, 16B can be extended using a planar edge termination structure to reduce the stress on the passivation material on the surface of the device. The connection between the two MOSFETs is lateral through the drift layer and the substrate.

Moreover, the total on-resistance of the device may be lower than the on-resistance of two discrete MOSFETs coupled in series as shown in FIG. 2 because of the additional lateral current flow that is present in a device having a structure as illustrated in FIG. 1A. Furthermore, the on-state resistance between the first and second MOSFET devices 20B can be reduced even further by providing the backside metallization 24 on the substrate 11.

Figure 3:
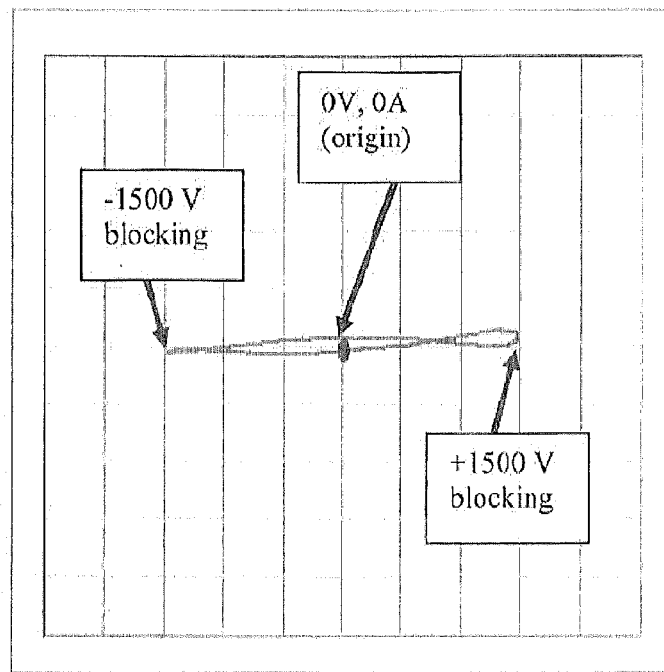
FIG. 3 is a graph illustrating the blocking characteristics of a bidirectional switch formed in accordance with the embodiments of FIG. 1.
Figure 4:
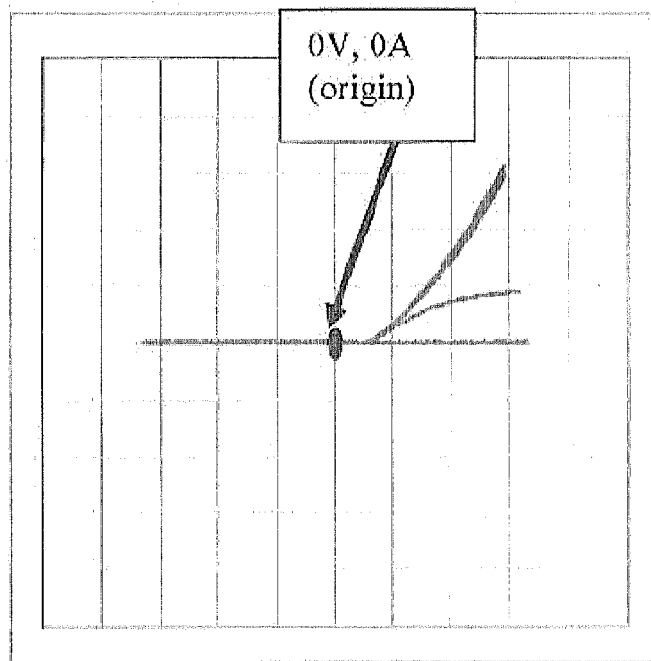
FIG. 4 is a graph illustrating the on-state characteristics of a bidirectional switch formed in accordance with the embodiments of FIG. 1.

FIGS. 3 and 4 are graphs illustrating example operating characteristics of a bidirectional switching device 10A formed with SiC MOSFETs as illustrated in FIG. 1A. The structure whose characteristics are shown in FIGS. 3 and 4 includes an n-type drift layer having a doping concentration of $6 \times 10^{15}$ cm$^{-3}$ provided on an n-type 4H—SiC substrate. With gate contacts tied to the source contacts, the structure was tested for blocking characteristics with $V_{G1S1}=0V$, $V_{G2S2}=0V$, and $V_{S1S2}$ varied up to +/−1500 V at room temperature. The on-state characteristics of the device were measured with $V_{G2S2}=0V$ and $V_{G1S1}$ set at 0V, 2V, 4V, and 6V. In the blocking state ($V_{G1S1}=0V, V_{G2S2}=0V$), the device showed blocking capabilities beyond 1500V in both positive and negative directions. The structure showed off-characteristics in the third quadrant. In the on-state measurements, the device showed active on-state behavior in the first quadrant, thereby demonstrating the capabilities of the bidirectional switching behavior. The term "third quadrant" means the operating range of a semiconductor switching device when both forward voltage and forward current are negative. For example, a MOSFET is operating in the third quadrant when $I_D$<0, and $V_{DS}$<0. The term "first quadrant" means the operating range of a semiconductor switching device when both forward voltage and forward current are positive, for example, for a MOSFET, when $I_D$>0, and $V_{DS}$>0. If the current-voltage (I-V) characteristics of the device are plotted on a graph, the characteristics of the switch (e.g. the MOSFET) will be on the "first quadrant" if the device is working in forward conduction ($I_D$>0, $V_{DS}$>0) and forward blocking ($V_{DS}$>0), and will be in the "third quadrant" if the device is working in a reverse conduction mode ($I_D$<0, $V_{DS}$<0) or reverse blocking mode ($V_{DS}$<0).

Figure 5:
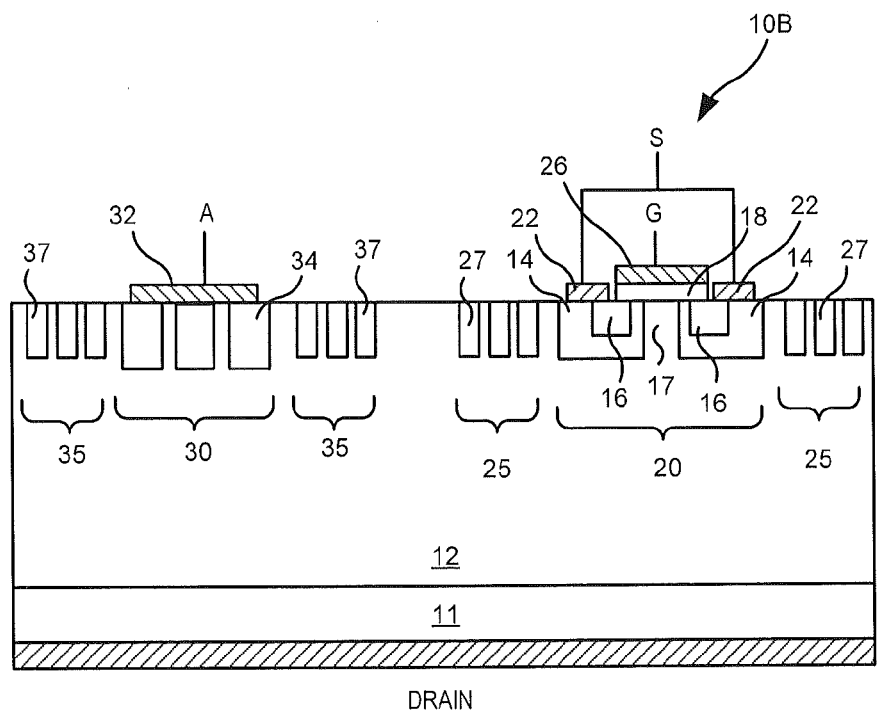
FIG. 5 is a cross-section of a monolithic switching device according to further embodiments.
Figure 6:
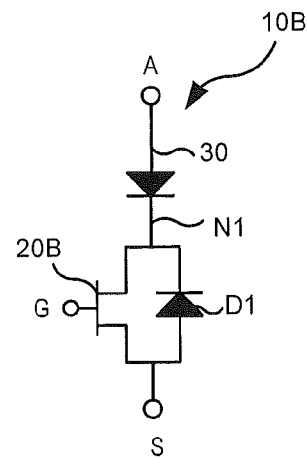
FIG. 6 is a schematic diagram showing an equivalent circuit of the structure shown in FIG. 5.

For applications that require bidirectional voltage blocking but do not require bidirectional current flow, one of the MOSFET devices can be replaced with a diode. For example, FIG. 5 is a cross-sectional view of a bidirectional switch 10B implemented with a junction barrier Schottky (JBS) diode and a MOSFET device, and FIG. 6 shows the equivalent circuit of the structure. Although a JBS diode is shown in FIG. 5, other types of diodes may be used, such as P-N diodes, PIN diodes, merged P-N Schottky (MPS) diodes, etc.

Referring to FIG. 5, a bidirectional switching device 10B according to some embodiments includes an optional substrate 11 on which a drift layer 12 having a first conductivity type is provided. The substrate 11 may be an n-type 4H—SiC substrate, and the drift layer 12 may be a silicon carbide epitaxial layer provided on the substrate 11. The drift layer 12 may be doped with n-type dopants at a doping concentration of $1\times10^{15}$ cm$^{-3}$ to $1\times10^{17}$ cm$^{-3}$ and a thickness of 5 μm to 50 μm. In particular embodiments, the drift layer 12 may be doped with n-type dopants at a doping concentration of $5\times10^{15}$ cm$^{-3}$ and may have a thickness of about 5 μm.

A MOS transistor device 20 having a vertical device structure is formed in/on the drift layer 12. The MOS transistor device 20 may be formed using similar process steps as described above with respect to MOS transistor device 20A shown in FIGS. 1A and 1B.

The MOS device structure 20 includes a pair of spaced apart well regions 14 at an upper surface of the drift layer 12 opposite the substrate 11. The well regions 14 have a second conductivity type that is opposite the first conductivity type. For example, when the drift layer 12 is n-type, the well regions 14 may be p-type. In particular embodiments, the well regions 14 may be doped with p-type dopants at a doping concentration of about $1\times10^{16}$ cm$^{-3}$ to about $1\times10^{17}$ cm$^{-3}$ and may extend to a depth of about 0.2 μm to about 2 μm into the drift layer 12. In particular embodiments, the well regions 14 may be doped with aluminum and/or boron at a concentration of about $5\times10^{17}$ cm$^{-3}$ and may extend to a depth of about 1 μm into the drift layer 12.

Source regions 16 having the first conductivity type are formed in the well regions 14. In particular embodiments, the source regions 16 may be doped with n-type dopants at a doping concentration of $1\times10^{18}$ cm$^{-3}$ to $5\times10^{21}$ cm$^{-3}$ and may extend to a depth of 0.1 μm to 1 μm into the well regions 14. In particular embodiments, the source regions 16 may be doped with n-type dopants at a concentration of about $5\times10^{20}$ cm$^{-3}$ and may extend to a depth of about 0.3 into the well regions 14.

A vertical current flow or JFET region 17 is defined in the drift layer 12 between the spaced apart well regions 14. A channel region is defined in the well regions 14 between the source regions 16 and the vertical current flow region 17.

A gate insulator 18 is provided on the upper surface of the drift layer 12 and extends across the channel regions and onto the source regions 16, and a gate contact 26 is provided on the gate insulator 18. Source contacts 22 are formed on the source regions 16 and the well regions 14 and form ohmic contacts thereto. A source terminal S is coupled to the source contacts 22, while a gate terminal G is coupled to the gate contact 26.

A junction termination 25 is provided around the periphery of the MOSFET device structure 20. In the embodiments illustrated in FIG. 5, the junction termination 25 includes a plurality of floating field rings 27 formed as doped regions in the drift layer 12 and having the second conductivity type. The junction termination may be implemented using other types of structures, including for example field plates, junction termination extension (JTE) regions, etc. In particular embodiments, the floating field rings 27 may be doped with p-type dopants at a doping concentration of about $5\times10^{16}$ cm$^{-3}$ to about $1\times10^{18}$ cm$^{-3}$ and may extend to a depth of about 0.1 μm to about 2 μm into the drift layer 12. The floating field rings 27 may have a width of about 1 and a pitch of about 2.5 μm.

A diode structure 30 is formed at the upper surface of the drift layer 12 adjacent the MOSFET device structure. The diode structure 30 may be a junction barrier Schottky (JBS) device including a Schottky contact 32 formed on the upper surface of the drift layer 12 and a plurality of JBS regions 34 provided at the surface of the drift layer 12. The Schottky contact 32 forms a Schottky junction with the drift layer 12. As noted above, other types of diodes may be used, such as P-N diodes, PIN diodes, merged P-N Schottky (MPS) diodes, etc., may be used in place of the JBS diode shown in FIG. 5.

As will be appreciated, the JBS regions 34 are doped to have a conductivity type that is opposite the conductivity type of the drift layer 12 so that the JBS regions 34 form respective P-N junctions with the drift layer 12. When the Schottky junction between the Schottky contact 32 and the drift layer 12 is reverse biased, a depletion region at the P-N junction between the JBS regions 34 and the drift layer 12 expands to block the reverse bias voltage. The Schottky junction may thereby be protected from high reverse bias voltages, which can improve the reliability of the device.

When the drift layer has n-type conductivity, the JBS regions 37 may be doped with p-type dopants at a doping concentration of about $1\times10^{16}$ cm$^{-3}$ to about $1\times10^{21}$ cm$^{-3}$ and may extend to a depth of about 0.1 μm to about 2 μm into the drift layer 12. Suitable Junction Barrier Schottky structures are disclosed, for example, in U.S. Publication No. 2009/0289262 entitled "Junction Barrier Schottky Diodes With Current Surge Capability" and U.S. Publication No. 2008/0029838, entitled "Semiconductor Devices Including Schottky Diodes With Controlled Breakdown And Methods Of Fabricating Same," the disclosures of which are incorporated herein by reference.

The diode structure 30 may include a junction termination structure 35 including a plurality of floating field rings. However, other junction terminations, including the junction termination structures discussed above, may be provided instead of or in addition to a floating field ring junction termination. Moreover, the junction termination structure 35 of the diode 30 may be similar to or different from the junction termination structure used for the MOSFET device 20.

An anode contact A is connected to the Schottky contact 32 of the diode 30.

Operation of the bidirectional switching device 10B will now be described with reference to FIGS. 5 and 6. The on-off status of the switching device 10B is controlled by the gate G of the MOSFET device 20, which can turn on/off the MOS- FET device 20. For example, if the gate G of the MOSFET device 20 is on, the switching device 10B is on, i.e., the device 10B will conduct current from the anode terminal A to the source terminal S of the MOSFET device 20. The device 10B will, however, block current from flowing in the reverse direction. If the gate G1 is off, the switching device 10B is off, and the device 10A blocks current from flowing between the anode terminal A of the diode 30 and the source terminal S of the MOSFET device 20. The forward voltage drop of the device 10B is determined by the forward voltage drop of the diode 10 and the drift resistance of the MOSFET device 20.

Figure 7A:
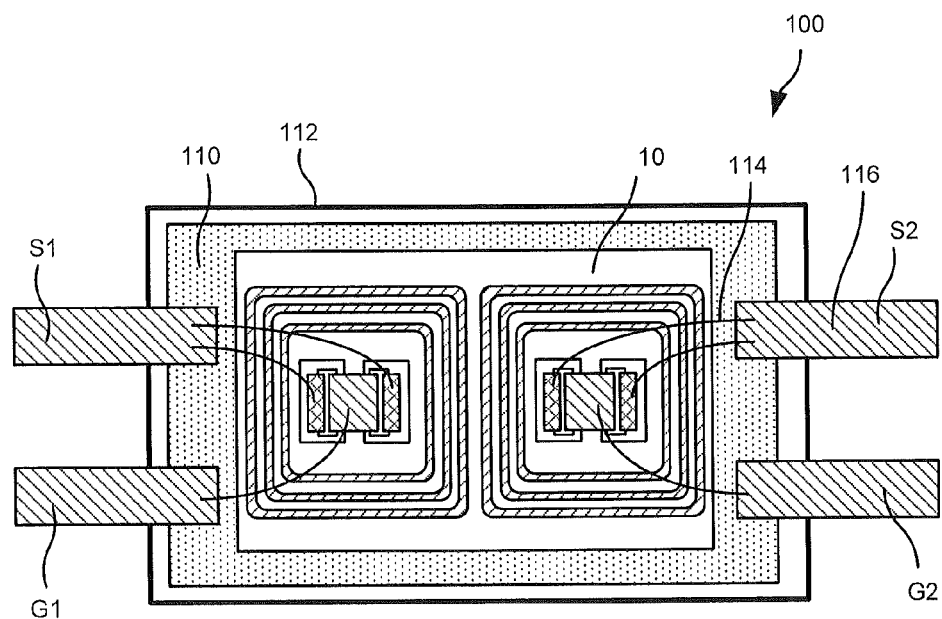
FIG. 7A is a plan view of a packaged switching device according to some embodiments.
Figure 7B:
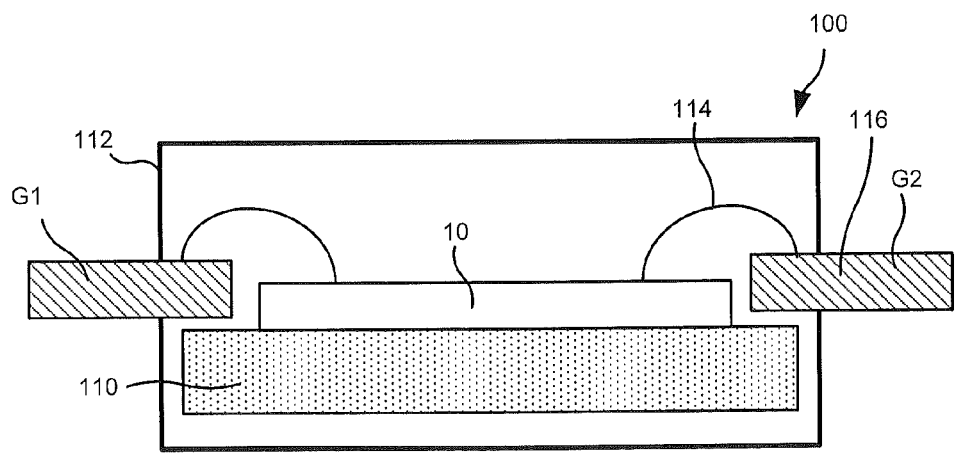
FIG. 7B is a cross sectional view of the packaged switching device of FIG. 7A.

FIG. 7A is a plan view of a packaged bidirectional switching device 100 according to some embodiments, and FIG. 7B is a cross sectional view of the packaged bidirectional switching device 100 of FIG. 7A. As shown therein, a packaged bidirectional switching device 100 according to some embodiments includes a submount 110 on which a bidirectional switching device 10 is mounted. The bidirectional switching device 10 can have the configuration shown in FIGS. 1A and 1B, FIG. 5 and/or any other configuration in accordance with the invention. The submount 110 may include an electrically conductive material such as copper and/or an electrically insulating material such as aluminum nitride. A package housing 112 encloses the submount 110 and the bidirectional switching device 10. The package housing may be filled with a dielectric protective material. In some embodiments, the housing 112 may include a plastic and may be formed around the submount 110 and the bidirectional switching device 10 by an injection molding process.

A plurality of electric leads 116 extend from the housing. The electric leads 116 are coupled to respective ones of the gate contacts 26A, 26B and the source contacts 22A, 22B by wirebond connectors 114 to provide the gate electrodes G1, G2 and the source electrodes S1, S2 as shown, for example, in FIG. 1. A similar configuration may be used for a bidirectional switching device as shown in FIG. 5. In that case, only three electric leads corresponding to the source electrode S, the gate electrode G and the anode electrode A may be used.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A monolithic bidirectional switching device, comprising:
a drift layer having a first conductivity type and having an upper surface; and
first and second vertical metal-oxide semiconductor (MOS) structures at the upper surface of the drift layer, wherein the drift layer provides a common drain for the first and second vertical MOS structures, and wherein the first and second vertical MOS structures are surrounded by respective first and second edge termination structures at the upper surface of the drift layer.

2. The monolithic bidirectional switching device of claim 1, wherein the first edge termination structure comprises a first plurality of guard rings in the upper surface of the drift layer, the first plurality of guard rings having a second conductivity type opposite the first conductivity type, and wherein the second edge termination structure comprises a second plurality of guard rings in the upper surface of the drift layer, the second plurality of guard rings having the second conductivity type.

3. The monolithic bidirectional switching device of claim 1, further comprising:

a substrate having the first conductivity type, wherein the drift layer is provided on a first surface of the substrate; and
a metal layer on a second surface of the substrate opposite the first surface.

4. The monolithic bidirectional switching device of claim 1, wherein the first MOS structure comprises:
a first well region at the upper surface of the drift layer, the first well region having a second conductivity type that is opposite the first conductivity type;
a first source region in the first well region, the first source region having the first conductivity type;
a first gate insulator on the upper surface of the drift layer and defining a channel region in the first well region adjacent the first source region;
a first gate contact on the first gate insulator; and
a first source contact on the first source region and on the first well region.

5. The monolithic bidirectional switching device of claim 4, wherein the first source contact forms an ohmic contact with the first source region and the first well region.

6. The monolithic bidirectional switching device of claim 4, wherein the second MOS structure comprises:
a second well region at the upper surface of the drift layer, the second well region having the second conductivity type;
a second source region in the second well region, the second source region having the first conductivity type;
a second gate insulator on the upper surface of the drift layer and defining a channel region in the second well region adjacent the second source region;
a second gate contact on the second gate insulator; and
a second source contact on the second source region and on the second well region.

7. The monolithic bidirectional switching device of claim 6, further comprising:
a third well region at the surface of the drift layer, the third well region spaced apart from the first well region and defining a first vertical current flow region in the drift layer between the first well region and the third well region;
a third source region in the third well region;
a third source contact on the third source region and the third well region;
a fourth well region at the surface of the drift layer, the fourth well region spaced apart from the second well region and defining a second vertical current flow region in the drift layer between the second well region and the fourth well region;
a fourth source region in the fourth well region; and
a fourth source contact on the fourth source region and the fourth well region.

8. The monolithic bidirectional switching device of claim 1, wherein the drift layer comprises silicon carbide.

9. A packaged electronic device, comprising:
a package housing;
a monolithic bidirectional switching device within the package housing, the monolithic bidirectional switching device comprising a drift layer having a first conductivity type and having an upper surface and first and second vertical metal-oxide semiconductor (MOS) structures at the upper surface of the drift layer, wherein the drift layer provides a common drain for the first and second vertical MOS structures, and wherein the first and second vertical MOS structures are surrounded by respective first and second edge termination structures at the upper surface of the drift layer; and a plurality of electrical leads coupled to the monolithic bidirectional switching device and extending from the housing.

10. A monolithic bidirectional switching device, comprising:
    a drift layer having a first conductivity type and having an upper surface; and
    first and second metal oxide semiconductor (MOS) structures at the upper surface of the drift layer, wherein the drift layer provides a common drain for the first and second vertical MOS structures;
    a first source contact coupled to the first MOS structure; and
    a second source contact coupled to the second MOS structure;
    wherein the first MOS structure comprises a first body diode having an anode and a cathode, wherein the anode of the first body diode is coupled to the first source contact;
    wherein the second MOS structure comprises a second body diode having an anode and a cathode, wherein the anode of the second body diode is coupled to the second source contact, and wherein the cathodes of the first and second body diodes are coupled to the common drain; and
    wherein the first and second source contacts are electrically isolated from one another and first and second gate contacts are electrically isolated from one another to thereby provide bidirectional blocking capability by the first MOS structure and the second MOS structure.

11. The monolithic bidirectional switching device of claim 10, wherein the first and second MOS structures are surrounded by respective first and second edge termination structures at the upper surface of the drift layer.

12. The monolithic bidirectional switching device of claim 11, wherein the first edge termination structure comprises a first plurality of guard rings in the upper surface of the drift layer, the first plurality of guard rings having a second conductivity type opposite the first conductivity type, and wherein the second edge termination structure comprises a second plurality of guard rings in the upper surface of the drift layer, the second plurality of guard rings having the second conductivity type.

13. The monolithic bidirectional switching device of claim 10, further comprising:
    a substrate having the first conductivity type, wherein the drift layer is provided on a first surface of the substrate; and
    a metal layer on a second surface of the substrate opposite the first surface.

14. The monolithic bidirectional switching device of claim 10, wherein the first MOS structure comprises:
    a first well region at the upper surface of the drift layer, the first well region having a second conductivity type that is opposite the first conductivity type;
    a first source region in the first well region, the first source region having the first conductivity type;
    a first gate insulator on the upper surface of the drift layer and defining a channel region in the first well region adjacent the first source region; and
    the first gate contact on the first gate insulator;
    wherein the first source contact is on the first source region and on the first well region.

15. The monolithic bidirectional switching device of claim 14, wherein the first source contact forms an ohmic contact with the first source region and the first well region.

16. The monolithic bidirectional switching device of claim 14, wherein the second MOS structure comprises:
    a second well region at the upper surface of the drift layer, the second well region having the second conductivity type;
    a second source region in the second well region, the second source region having the first conductivity type;
    a second gate insulator on the upper surface of the drift layer and defining a channel region in the second well region adjacent the second source region; and
    the second gate contact on the second gate insulator;
    wherein the second source contact is on the second source region and on the second well region.

17. The monolithic bidirectional switching device of claim 16, further comprising:
    a third well region at the surface of the drift layer, the third well region spaced apart from the first well region and defining a first vertical current flow region in the drift layer between the first well region and the third well region;
    a third source region in the third well region;
    a third source contact on the third source region and the third well region;
    a fourth well region at the surface of the drift layer, the fourth well region spaced apart from the second well region and defining a second vertical current flow region in the drift layer between the second well region and the fourth well region;
    a fourth source region in the fourth well region; and
    a fourth source contact on the fourth source region and the fourth well region.

18. The monolithic bidirectional switching device of claim 10, wherein the drift layer comprises silicon carbide.

* * * * *